US011015247B2

(12) United States Patent
Batzer et al.

(10) Patent No.: US 11,015,247 B2
(45) Date of Patent: May 25, 2021

(54) INTEGRATED SHOWERHEAD WITH IMPROVED HOLE PATTERN FOR DELIVERING RADICAL AND PRECURSOR GAS TO A DOWNSTREAM CHAMBER TO ENABLE REMOTE PLASMA FILM DEPOSITION

(71) Applicant: LAM RESEARCH CORPORATION, Fremont, CA (US)

(72) Inventors: Rachel Batzer, Tualatin, OR (US); Zhe Gui, Tigard, OR (US); Galbokka Hewage Layan Savithra, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 136 days.

(21) Appl. No.: 16/213,386

(22) Filed: Dec. 7, 2018

(65) Prior Publication Data
US 2019/0177846 A1 Jun. 13, 2019

Related U.S. Application Data

(60) Provisional application No. 62/596,409, filed on Dec. 8, 2017.

(51) Int. Cl.
C23C 16/40 (2006.01)
C23C 16/455 (2006.01)
H01J 37/32 (2006.01)

(52) U.S. Cl.
CPC .. C23C 16/45565 (2013.01); H01J 37/32743 (2013.01); H01J 2237/332 (2013.01); H01J 2237/334 (2013.01)

(58) Field of Classification Search
CPC . C23C 16/45565; C23C 16/505; C23C 16/52; C23C 16/46; H01J 37/32743; H01J 2237/334; H01J 2237/332
(Continued)

(56) References Cited

U.S. PATENT DOCUMENTS

| 5,597,439 A | 1/1997 | Salzman |
| 5,614,026 A | 3/1997 | Williams |

(Continued)

FOREIGN PATENT DOCUMENTS

| CN | 1574229 A | 2/2005 |
| CN | 101405433 A | 4/2009 |

(Continued)

OTHER PUBLICATIONS

International Search Report and Written Opinion Corresponding to Application No. PCT/US2018/064524 dated Apr. 1, 2019, 10 pages.
(Continued)

*Primary Examiner* — Rudy Zervigon (57) ABSTRACT

A showerhead for a substrate processing system includes a lower surface, a plasma-facing upper surface, a gas plenum defined between the lower surface and the upper surface, and a plurality of injectors distributed on the lower surface, wherein the plurality of injectors are in fluid communication with the gas plenum. A plurality of through holes extends from the upper surface to the lower surface. Selected ones of the plurality of through holes have a diameter that is different from a diameter of remaining ones of the plurality of through holes. The diameter of the selected ones of the plurality of through holes is predetermined in accordance with a desired ratio of respective gases provided via the selected ones of the plurality of through holes and the remaining ones of the plurality of through holes.

14 Claims, 6 Drawing Sheets

(58) Field of Classification Search
USPC .............. 118/715, 723 I, 723 IR; 156/345.1, 156/345.48, 345.49
See application file for complete search history.

(56) References Cited

U.S. PATENT DOCUMENTS

| | | | |
|---|---|---|---|
| 5,871,586 | A | 2/1999 | Crawley et al. |
| 5,919,382 | A | 7/1999 | Qian et al. |
| 6,036,878 | A | 3/2000 | Collins |
| 6,054,013 | A | 4/2000 | Collins et al. |
| 6,059,885 | A | 5/2000 | Ohashi et al. |
| 6,089,472 | A | 7/2000 | Carter |
| 6,148,761 | A | 11/2000 | Majewski et al. |
| 6,200,412 | B1 | 3/2001 | Kilgore et al. |
| 6,251,188 | B1 | 6/2001 | Hashimoto et al. |
| 6,291,793 | B1 | 9/2001 | Qian et al. |
| 6,306,247 | B1 | 10/2001 | Lin |
| 6,387,182 | B1 | 5/2002 | Horie et al. |
| 6,387,207 | B1 | 5/2002 | Janakiraman et al. |
| 6,444,039 | B1 | 9/2002 | Nguyen |
| 6,565,661 | B1 | 5/2003 | Nguyen |
| 6,635,117 | B1 | 10/2003 | Kinnard et al. |
| 6,727,654 | B2 | 4/2004 | Ogawa et al. |
| 6,782,843 | B2 | 8/2004 | Kinnard et al. |
| 6,921,437 | B1* | 7/2005 | DeDontney ........ C23C 16/45565 118/715 |
| 7,156,921 | B2* | 1/2007 | Byun ................... B82Y 10/00 118/50 |
| 7,296,534 | B2 | 11/2007 | Fink |
| 7,479,303 | B2* | 1/2009 | Byun ................ C23C 16/45519 118/715 |
| 7,846,291 | B2 | 12/2010 | Otsuki |
| 7,931,749 | B2 | 4/2011 | Amikura et al. |
| 7,976,631 | B2 | 7/2011 | Burrows et al. |
| 8,083,853 | B2 | 12/2011 | Choi et al. |
| 8,231,799 | B2 | 7/2012 | Bera et al. |
| 8,298,370 | B2* | 10/2012 | Byun ................ C23C 16/45565 156/345.34 |
| 8,308,865 | B2 | 11/2012 | Kim et al. |
| 8,328,939 | B2 | 12/2012 | Choi et al. |
| 8,361,275 | B2 | 1/2013 | Tahara et al. |
| 8,361,892 | B2 | 1/2013 | Tam et al. |
| 8,419,959 | B2 | 4/2013 | Bettencourt et al. |
| 8,512,509 | B2 | 8/2013 | Bera et al. |
| 8,608,852 | B2 | 12/2013 | Mahadeswaraswamy et al. |
| 8,679,956 | B2 | 3/2014 | Tam et al. |
| 8,721,791 | B2 | 5/2014 | Tiner et al. |
| 8,764,902 | B2 | 7/2014 | Suzuki et al. |
| 8,869,742 | B2 | 10/2014 | Dhindsa et al. |
| 8,882,913 | B2* | 11/2014 | Byun ................ C23C 16/45514 118/715 |
| 9,057,128 | B2 | 6/2015 | Olgado |
| 9,315,897 | B2* | 4/2016 | Byun ................ C23C 16/45574 |
| 9,349,619 | B2 | 5/2016 | Kawamata et al. |
| 9,441,791 | B2 | 9/2016 | Mizusawa et al. |
| 9,447,499 | B2 | 9/2016 | Roy et al. |
| 9,476,121 | B2 | 10/2016 | Byun et al. |
| 9,677,176 | B2 | 6/2017 | Chandrasekharan et al. |
| 2002/0017243 | A1 | 2/2002 | Pyo |
| 2003/0010451 | A1 | 1/2003 | Tzu et al. |
| 2003/0019580 | A1* | 1/2003 | Strang ............... C23C 16/45589 156/345.33 |
| 2003/0051665 | A1 | 3/2003 | Zhao et al. |
| 2003/0054099 | A1 | 3/2003 | Jurgensen et al. |
| 2003/0077388 | A1* | 4/2003 | Byun ................ C23C 16/45591 427/255.28 |
| 2004/0031565 | A1 | 2/2004 | Su et al. |
| 2004/0216844 | A1 | 11/2004 | Janakiraman et al. |
| 2004/0226507 | A1 | 11/2004 | Carpenter et al. |
| 2005/0000430 | A1 | 1/2005 | Jang et al. |
| 2005/0092248 | A1 | 5/2005 | Lee et al. |
| 2005/0241579 | A1 | 11/2005 | Kidd |
| 2005/0241765 | A1 | 11/2005 | Dhindsa et al. |
| 2005/0241767 | A1 | 11/2005 | Ferris et al. |
| 2006/0021703 | A1 | 2/2006 | Umotoy et al. |
| 2006/0191637 | A1 | 8/2006 | Zajac et al. |
| 2006/0228496 | A1 | 10/2006 | Choi et al. |
| 2006/0263522 | A1* | 11/2006 | Byun ................ C23C 16/45565 427/248.1 |
| 2007/0068798 | A1 | 3/2007 | Honda et al. |
| 2007/0110918 | A1 | 5/2007 | Yuda et al. |
| 2007/0163440 | A1 | 7/2007 | Kim et al. |
| 2007/0193515 | A1 | 8/2007 | Jeon et al. |
| 2007/0215048 | A1 | 9/2007 | Suzuki et al. |
| 2007/0264427 | A1 | 11/2007 | Shinriki et al. |
| 2007/0272154 | A1 | 11/2007 | Amikura et al. |
| 2008/0017315 | A1 | 1/2008 | Fukuchi |
| 2008/0020146 | A1 | 1/2008 | Choi et al. |
| 2008/0156264 | A1 | 7/2008 | Fair et al. |
| 2008/0156631 | A1 | 7/2008 | Fair et al. |
| 2009/0008034 | A1 | 1/2009 | Tahara et al. |
| 2009/0095222 | A1 | 4/2009 | Tam et al. |
| 2009/0095621 | A1 | 4/2009 | Kao et al. |
| 2009/0098276 | A1 | 4/2009 | Burrows et al. |
| 2009/0169744 | A1 | 7/2009 | Byun et al. |
| 2009/0178615 | A1 | 7/2009 | Kim et al. |
| 2009/0178616 | A1* | 7/2009 | Byun ................ C23C 16/45574 118/715 |
| 2009/0202721 | A1 | 8/2009 | Nogami et al. |
| 2009/0223449 | A1 | 9/2009 | Ishida |
| 2009/0236313 | A1 | 9/2009 | Qiu et al. |
| 2009/0266911 | A1 | 10/2009 | Kim et al. |
| 2009/0320756 | A1 | 12/2009 | Tanaka |
| 2010/0003405 | A1 | 1/2010 | Kappeler |
| 2010/0003406 | A1 | 1/2010 | Lam et al. |
| 2010/0184298 | A1 | 7/2010 | Dhindsa |
| 2010/0263588 | A1 | 10/2010 | Zhiyin |
| 2010/0300359 | A1 | 12/2010 | Armour et al. |
| 2011/0023782 | A1 | 2/2011 | Han |
| 2011/0039402 | A1 | 2/2011 | Yamazaki et al. |
| 2011/0048325 | A1 | 3/2011 | Choi et al. |
| 2011/0052833 | A1 | 3/2011 | Hanawa et al. |
| 2011/0065276 | A1 | 3/2011 | Ganguly et al. |
| 2011/0073038 | A1 | 3/2011 | Chien et al. |
| 2011/0088847 | A1 | 4/2011 | Law et al. |
| 2011/0253044 | A1 | 10/2011 | Tam et al. |
| 2011/0256315 | A1 | 10/2011 | Tam et al. |
| 2011/0256692 | A1 | 10/2011 | Tam et al. |
| 2011/0308551 | A1 | 12/2011 | Chung et al. |
| 2012/0031559 | A1 | 2/2012 | Dhindsa et al. |
| 2012/0052216 | A1 | 3/2012 | Hanawa et al. |
| 2012/0067971 | A1* | 3/2012 | Byun ................ C23C 16/45591 239/106 |
| 2012/0135609 | A1 | 5/2012 | Yudovsky et al. |
| 2012/0161405 | A1 | 6/2012 | Mohn et al. |
| 2012/0225564 | A1 | 9/2012 | Adachi et al. |
| 2012/0234945 | A1 | 9/2012 | Olgado |
| 2012/0269968 | A1 | 10/2012 | Rayner, Jr. |
| 2013/0052804 | A1 | 2/2013 | Song |
| 2013/0093146 | A1 | 4/2013 | Aihara et al. |
| 2013/0109159 | A1 | 5/2013 | Carlson |
| 2013/0288485 | A1 | 10/2013 | Liang et al. |
| 2013/0341433 | A1 | 12/2013 | Roy et al. |
| 2014/0103145 | A1 | 4/2014 | White et al. |
| 2014/0179114 | A1 | 6/2014 | van Schravendijk |
| 2014/0235069 | A1 | 8/2014 | Breiling et al. |
| 2014/0272185 | A1 | 9/2014 | Na et al. |
| 2015/0004313 | A1 | 1/2015 | Byun et al. |
| 2015/0007770 | A1 | 1/2015 | Chandrasekharan et al. |
| 2015/0007771 | A1 | 1/2015 | Silva et al. |
| 2015/0377481 | A1 | 12/2015 | Smith et al. |
| 2015/0380221 | A1 | 12/2015 | Liu et al. |
| 2016/0340782 | A1 | 11/2016 | Chandrasekharan et al. |
| 2016/0348242 | A1 | 12/2016 | Sung et al. |

FOREIGN PATENT DOCUMENTS

| | | |
|---|---|---|
| CN | 101423936 A | 5/2009 |
| CN | 101423937 A | 5/2009 |
| CN | 102424956 A | 4/2012 |
| JP | H05186292 A | 7/1993 |
| JP | H08239775 A | 9/1996 |
| JP | 2002030445 A | 1/2002 |
| JP | 2002033311 A | 1/2002 |

(56) References Cited

FOREIGN PATENT DOCUMENTS

| JP | 2006261217 A | 9/2006 |
|---|---|---|
| JP | 201084190 A | 4/2010 |
| TW | 490705 B | 6/2002 |
| TW | 492045 B | 6/2002 |
| TW | 200710928 A | 3/2007 |
| TW | 201229300 A | 7/2012 |
| WO | WO-2011044451 A2 | 4/2011 |
| WO | WO-2012122054 A2 | 9/2012 |

OTHER PUBLICATIONS

U.S. Office Action dated Oct. 20, 2017 issued in U.S. Appl. No. 13/842,054.
U.S. Notice of Allowance dated Mar. 8, 2018 issued in U.S. Appl. No. 15/163,594.
Chinese Fourth Office Action dated Sep. 13, 2017 issued in Application No. CN 201410052998.X.
Japanese First Office Action dated Nov. 7, 2017 issued in Application No. JP 2014-021856.
Chinese First Office Action dated Apr. 10, 2018 issued in Application No. CN 201610361563.2.
U.S. Office Action dated Apr. 12, 2017 issued in U.S. Appl. No. 13/842,054.
U.S. Notice of Allowance dated Apr. 14, 2017 issued in U.S. Appl. No. 13/934,597.
Taiwan Examination and Search Report dated Apr. 11, 2017 issued in Application No. TW 102147584.
Chinese Third Office Action dated Mar. 2, 2017 issued in Application No. CN 201410052998.X.
Taiwan Examination and Search Report dated May 12, 2017 issued in Application No. TW 103104956.
U.S. Appl. No. 13/842,054, filed Mar. 15, 2013, entitled "Radical Source Design for Remote Plasma Atomic Layer Deposition."
U.S. Appl. No. 13/934,597, filed Jul. 3, 2013, entitled "Multi-Plenum, Dual-Temperature Showerhead."
U.S. Office Action dated Dec. 3, 2015 issued in U.S. Appl. No. 13/842,054.
U.S. Final Office Action dated May 18, 2016 issued in U.S. Appl. No. 13/842,054.
U.S. Office Action dated Sep. 8, 2016 issued in U.S. Appl. No. 13/842,054.
U.S. Office Action dated Apr. 7, 2016 issued in U.S. Appl. No. 13/934,597.
U.S. Final Office Action dated Sep. 16, 2016 issued in U.S. Appl. No. 13/934,597.
U.S. Notice of Allowance dated Jan. 10, 2017 issued in U.S. Appl. No. 13/934,597.
U.S. Office Action dated Mar. 13, 2015 issued in U.S. Appl. No. 13/531,254.
U.S. Office Action dated Sep. 17, 2015 issued in U.S. Appl. No. 13/531,254.
U.S. Notice of Allowance dated Jan. 15, 2016 issued in U.S. Appl. No. 13/531,254.
U.S. Notice of Allowance dated May 12, 2016 issued in U.S. Appl. No. 13/531,254.
Chinese First Office Action dated Dec. 9, 2015 issued in Application No. CN 20140052988.X.
Chinese Second Office Action dated Jul. 27, 2016 issued in Application No. CN 20140052988.X.
Singapore Search Report and Written Opinion dated Jul. 7, 2015 issued in Application No. SG 201401171-2.
Singapore Final Examination Report dated Jan. 12, 2016 issued in Application No. SG 201401171-2.
Chinese First Office Action dated May 2, 2016 issued in Application No. CN 201410312720.1.
Taiwan Examination and Search Report dated Oct. 13, 2016 issued in Application No. TW 102122169.

\* cited by examiner

INTEGRATED SHOWERHEAD WITH IMPROVED HOLE PATTERN FOR DELIVERING RADICAL AND PRECURSOR GAS TO A DOWNSTREAM CHAMBER TO ENABLE REMOTE PLASMA FILM DEPOSITION

CROSS-REFERENCE TO RELATED APPLICATIONS

This application claims the benefit of U.S. Provisional Application No. 62/596,409, filed on Dec. 8, 2017. The present disclosure is related to commonly assigned U.S. patent application Ser. No. 15/378,854, filed on Dec. 14, 2016. The entire disclosures of the applications referenced above are incorporated herein by reference.

FIELD

The present disclosure relates to substrate processing systems, and more particularly to substrate processing systems including showerheads that deliver radicals and precursor gas to a downstream chamber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit film on a substrate such as a semiconductor wafer. The substrate processing systems typically include a processing chamber and a substrate support. During film deposition, radicals and precursor gas are supplied to the processing chamber.

For example, the processing chamber may include an upper chamber, a lower chamber and a substrate support. A showerhead may be arranged between the upper chamber and the lower chamber. The substrate is arranged on the substrate support in the lower chamber. A plasma gas mixture is supplied to the upper chamber and plasma is struck in the upper chamber. Some of the radicals generated by the plasma flow through the showerhead to the lower chamber. The showerhead filters ions and shields UV light from reaching the lower chamber. A precursor gas mixture is supplied to the lower chamber through the showerhead and reacts with the radicals to deposit film on the substrate.

SUMMARY

A showerhead for a substrate processing system includes a lower surface, a plasma-facing upper surface, a gas plenum defined between the lower surface and the upper surface, and a plurality of injectors distributed on the lower surface, wherein the plurality of injectors are in fluid communication with the gas plenum. A plurality of through holes extends from the upper surface to the lower surface. Selected ones of the plurality of through holes have a diameter that is different from a diameter of remaining ones of the plurality of through holes. The diameter of the selected ones of the plurality of through holes is predetermined in accordance with a desired ratio of respective gases provided via the selected ones of the plurality of through holes and the remaining ones of the plurality of through holes.

In other features, the selected ones of the plurality of through holes include a first type of through hole having an average diameter satisfying a predetermined ratio relationship with an average diameter of the remaining ones of the plurality of through holes. The selected ones of the plurality of through holes includes at least a first type of through hole satisfying a first predetermined ratio relationship with an average diameter of the remaining ones of the plurality of through holes and a second type of through hole satisfying a second predetermined ratio relationship with an average diameter of the remaining ones of the plurality of through holes. The diameter of the selected ones of the plurality of through holes is predetermined in accordance with deposition non-uniformities associated with showerhead.

In other features, on the lower surface of the showerhead, the through holes are arranged in a plurality of groups each including two or more of the through holes distributed around a respective one of the plurality of injectors. On the lower surface of the showerhead, the through holes are arranged in a plurality of groups each including three of the through holes distributed around a respective one of the plurality of injectors. The three of the through holes in each of the plurality of groups are distributed in a triangle configuration around the respective one of the plurality of injectors. The three of the through holes in each of the plurality of groups are radially distributed around the respective one of the plurality of injectors.

In other features, the plurality of through holes includes at least one central group of through holes and a first plurality of groups of the through holes arranged in a first hexagonal pattern around the at least one central group. A second plurality of groups of the through holes is arranged in a second hexagonal pattern around the first plurality of groups. The plurality of through holes includes at least one central group and a first plurality of groups of the through holes arranged in a first circular pattern around the at least one central group. At least one second plurality of groups of the through holes is arranged in a second circular pattern around the first plurality of groups.

In other features, the plurality of through holes includes a plurality of groups of the through holes, the plurality of groups of through holes includes at least one central group, and remaining groups of the plurality of groups are arranged in an increasing 6 pattern around the at least one central group. The plurality of through holes includes a plurality of groups of the through holes, the plurality of groups of through holes includes at least one central group, and remaining groups of the plurality of groups are arranged in an increasing 8 pattern around the at least one central group. A plurality of gas injector nozzles extends downward from respective ones of the injectors. The plurality of through holes includes 85 groups of the through holes.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Typically, a showerhead in a substrate processing system does not have a thermal control system. However, in some processing systems, a basic thermal control system is used to control a temperature of an outer edge of the showerhead, which is accessible and not under vacuum. The basic thermal control system does not uniformly control temperature across the showerhead due to the heat from the plasma. In other words, the temperature at the center of the showerhead increases. Temperature changes also occur with process changes such as plasma on/off, pressure, flow rate, and/or pedestal temperature. Variations in the temperature of the showerhead adversely impact the uniformity of the deposition process and defect performance. The location, arrangement and size of through holes and gas injectors in the showerhead also may adversely affect deposition uniformity A showerhead according to the present disclosure includes a predetermined pattern of precursor injectors and through holes for radicals. The pattern and sizing of the through holes impacts on-wafer deposition rates and distribution. The showerhead is typically circular to match a shape of a substrate to be processed. It is often difficult to uniformly arrange the precursor injectors and through holes in all of the desired locations of the showerhead. Standard patterns of the precursor injectors and through holes for the radicals tend to create non-uniform deposition patterns in either azimuthal and/or radial directions.

The present disclosure relates to a substrate processing system including a showerhead including a predetermined pattern and sizing of precursor injectors and through holes for radicals to provide more uniform deposition performance. In some examples, the arrangements and sizing variations disclosed herein reduce showerhead-caused deposition variation by up to approximately 50%.

The showerhead provides uniform temperature control by supplying heat transfer fluid to channels through a center portion of the showerhead to maintain a uniform and controlled temperature. The showerhead also supplies uniform precursor gas flow delivery to a chamber including the substrate. In some examples, the substrate processing system can be used to deposit conformal carbide films, although other types of film can be deposited.

Figure 1:
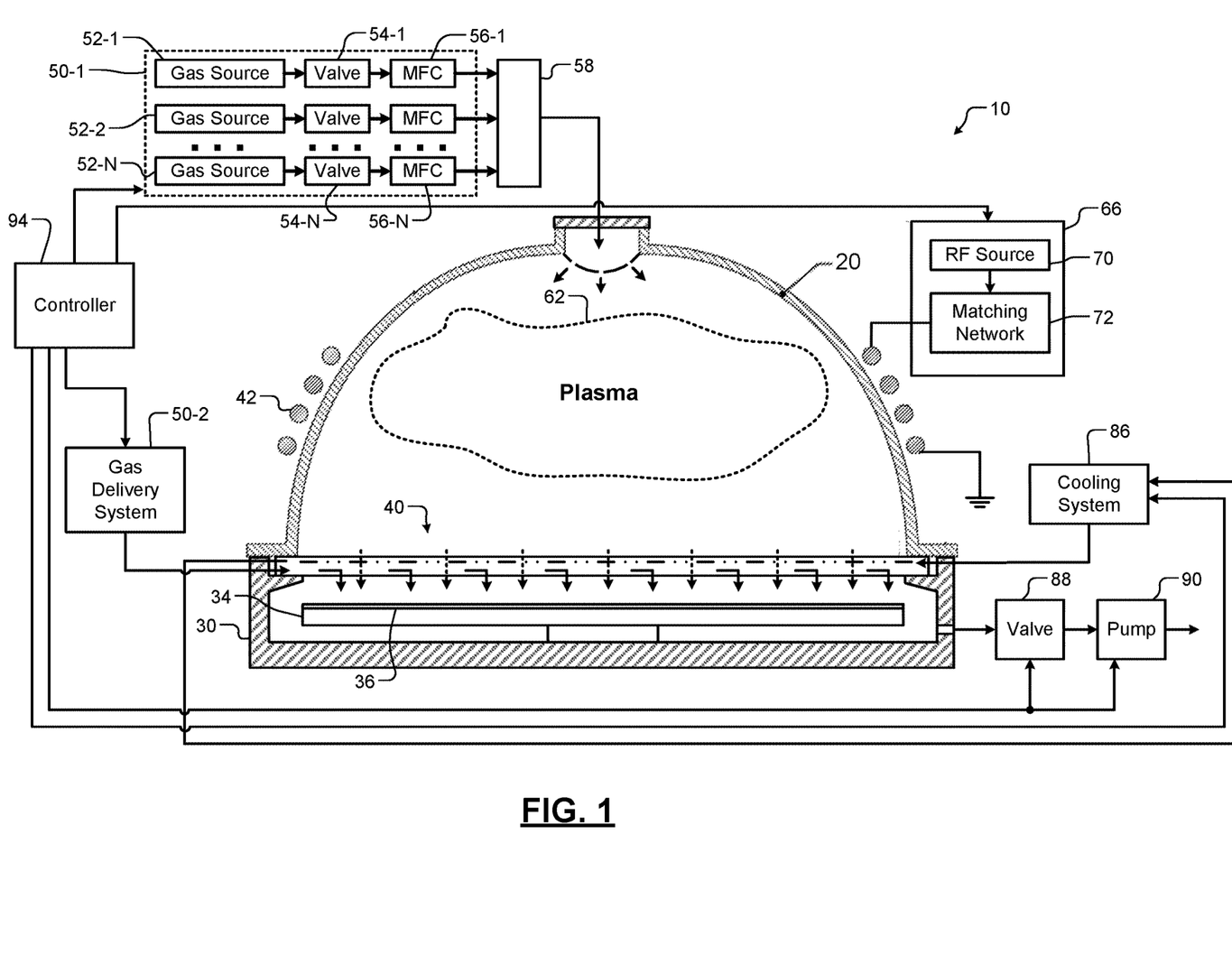
FIG. 1 is a functional block diagram of an example of a substrate processing chamber including a showerhead according to the present disclosure.

Referring now to FIG. 1, a substrate processing system 10 includes an upper chamber 20 and a lower chamber 30. While a specific type of substrate processing system is shown and described herein, other types and/or arrangements may be used. While inductively coupled plasma is shown, other types of plasma generation may be used such as capacitively coupled plasma, remote plasma sources, or other suitable plasma generators.

In some examples, the upper chamber 20 may include a dome shaped chamber, although other chamber shapes can be used. A substrate support 34 is arranged in the lower chamber 30. A substrate 36 is arranged on the substrate support 34 during substrate treatment. A showerhead 40 is arranged between the upper chamber 20 and the lower chamber 30. Inductive coils 42 may be arranged around the upper chamber 20. The showerhead 40 defines a heat transfer plenum (an example of the heat transfer plenum is shown in FIG. 6) to cool the showerhead and a gas plenum (an example of the gas plenum is shown in FIG. 7) to deliver precursor gas to the lower chamber 30.

A gas delivery system 50-1 may be used to supply a process gas mixture including plasma gas to the upper chamber 20. The gas delivery system 50-1 includes one or more gas sources 52-1, 52-2, . . . , and 52-N, valves 54-1, . . . , and 54-N, mass flow controllers (MFC) 56-1, . . . , and 56-N, and a manifold 58, although other types of gas delivery systems can be used (where N is an integer). A gas delivery system 50-2 delivers a process gas mixture including precursor gas to the showerhead 40.

An RF plasma generator 66 includes an RF source 70 and a matching network 72. The RF plasma generator 66 selectively supplies RF power to the inductive coil 42 (while plasma gas is supplied) to generate plasma 62 in the upper chamber 20.

A thermal control system 86 may be used to supply heat transfer fluid such gas or a liquid coolant to the showerhead 40 to control a temperature of the showerhead 40. A valve 88 and a pump 90 may be used to evacuate reactants.

A controller 94 communicates with the gas delivery systems 50-1 and 50-2 to selectively supply process gases as needed to the upper chamber 20 and the showerhead 40. The controller 94 communicates with the RF plasma generator 66 to generate and extinguish plasma in the upper chamber 20.

The controller 94 communicates with the thermal control system 86 to control a flow rate and temperature of heat transfer fluid. The heat transfer fluid is used to control the temperature of the showerhead 40. In some examples, the heat transfer fluid may include water, water mixed with ethylene glycol, perfluoropolyether fluorinated fluid or other fluid and/or one or more gases. In some examples, the thermal control system 86 controls the flow rate or temperature of the heat transfer fluid using a closed loop control system. In other examples, the thermal control system 86 controls the flow rate and temperature using proportional integral derivative (PID) control. The heat transfer fluid may be provided in an open loop system from a water circulation system. In some examples, the heat transfer fluid is hermetically sealed from the vacuum chamber.

In some examples, the controller 94 may be connected to one or more temperature sensors (not shown) arranged in the showerhead 40 to sense one or more temperatures of the showerhead 40. In some examples, the controller 94 may be connected to one or more pressure sensors (not shown) arranged in the showerhead 40 to sense one or more pressures in the processing chamber. The controller 94 communicates with the valve 88 and the pump 90 to control pressure within the upper and lower chambers 20, 30 and to selectively evacuate reactants therefrom.

Figure 2:
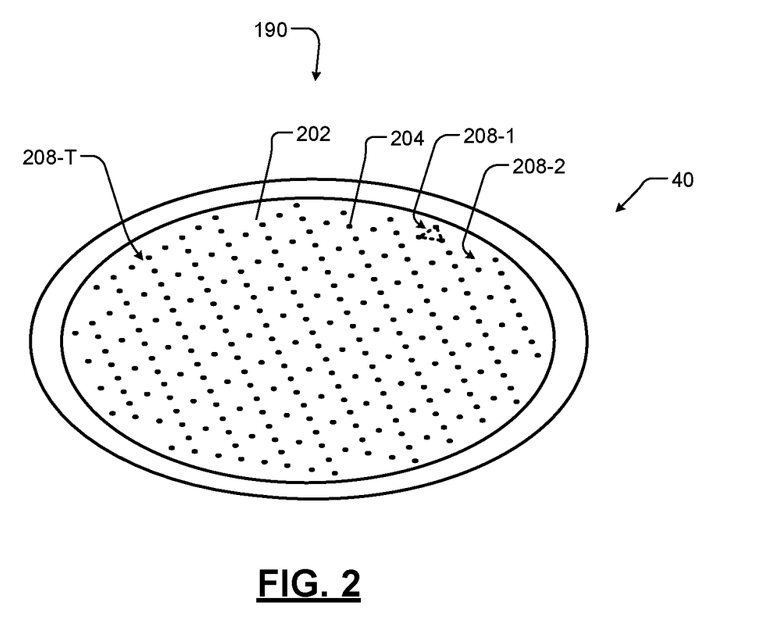
FIG. 2 is a top perspective view of an example of the showerhead according to the present disclosure.
Figure 3:
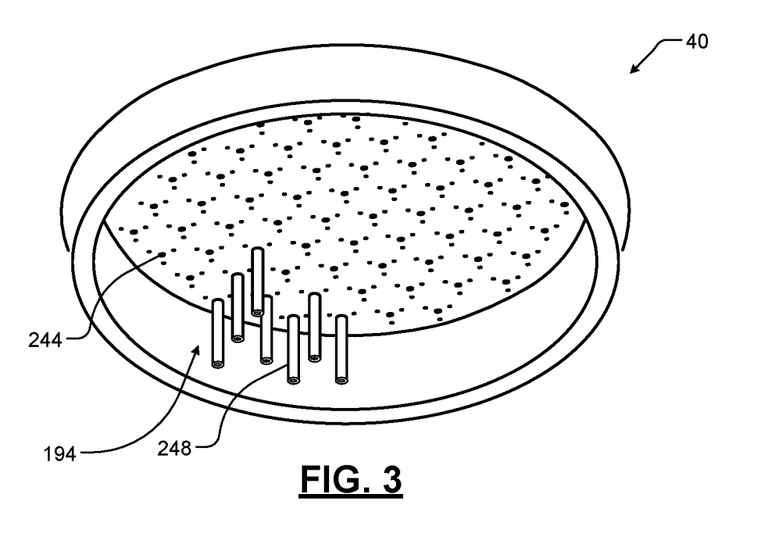
FIG. 3 is a bottom perspective view of an example of the showerhead according to the present disclosure.

Referring now to FIGS. 2 and 3, perspective views of an upper surface 190 and a lower surface 194 of the showerhead 40 are shown, respectively. The showerhead 40 includes a plasma-facing surface 202 including a plurality of through holes 204. In some examples, the plasma-facing surface 202 is circular, although other shapes can be used. In some examples, the plasma-facing surface 202 has a diameter of approximately 400 mm, although other diameters may be used.

Figure 4:
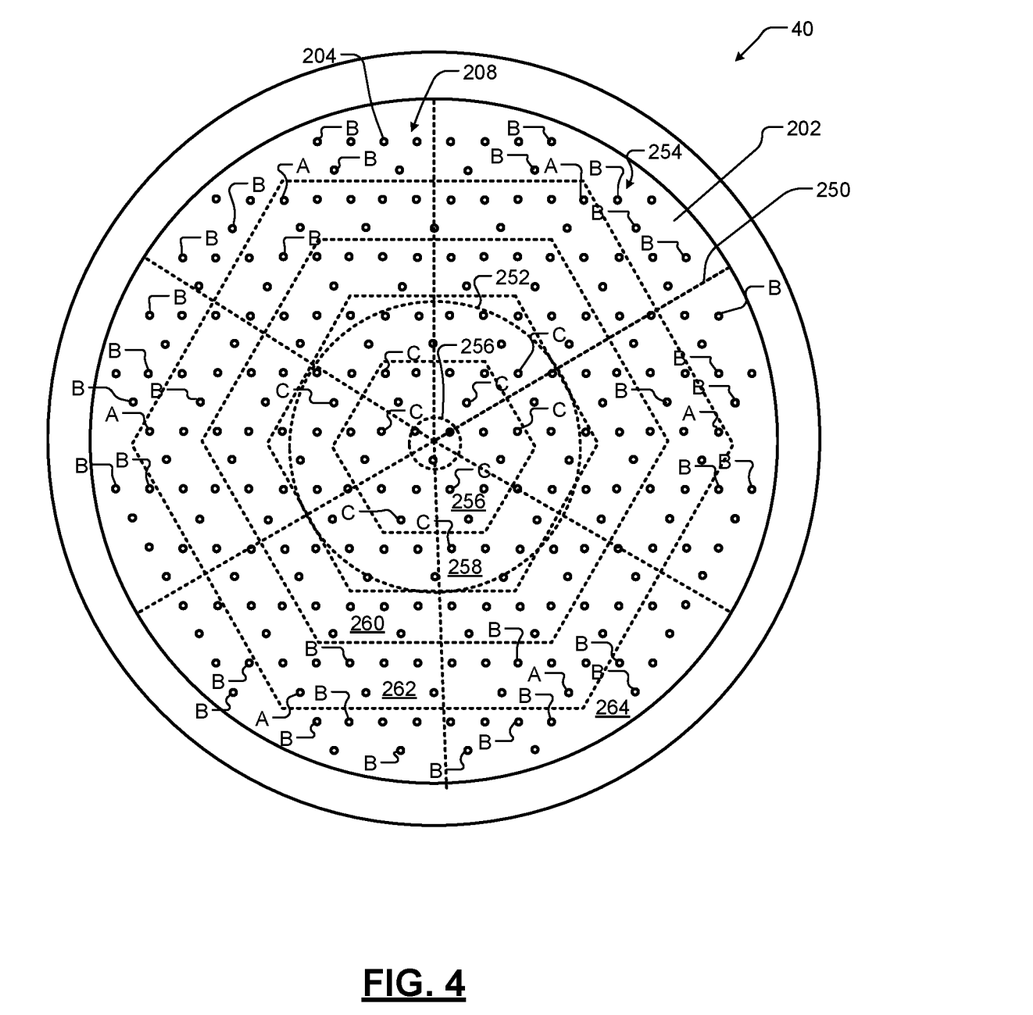
FIG. 4 is a plan view of an example of the showerhead according to the present disclosure.

In some examples, the through holes 204 extend from the upper surface 190 of the showerhead 40 to the lower surface 194 of the showerhead. In some examples, the through holes 204 are arranged in groups 208-1, 208-2, . . . , and 208-T (collectively groups of through holes 208), where each of the groups includes R through holes, where R and T are integers greater than one. In other examples, R is one. In this example, each of the groups of through holes 208 includes three through holes 204 that are arranged in a triangle configuration, although other shapes and numbers of through holes can be used. In some examples, the groups of through holes 208 are arranged in a hexagonal pattern which is best seen in FIG. 4. In the triangle based pattern, the through holes may be arranged in a half-spaced triangle pattern or arranged radially around each injector. In another example pattern, the through holes are arranged radially around each injector (e.g., in a circular based pattern).

A precursor gas is supplied to a gas plenum (not shown) located inside of the showerhead 40. The precursor gas exits the gas plenum via a plurality of injectors 244. In some examples, each of the plurality of injectors 244 includes a restricted orifice. In some examples, each of the groups of through holes 208 includes at least one of the plurality of injectors 244. Each of the through holes 204 in a given one of the groups 208 is nearer to an associated one of the injectors 244 (i.e., an injector that the group 208 is clustered around) than to any others of the injectors 244. As shown in FIG. 3, gas injector nozzles 248 may be arranged on respective ones of the injectors 244. The nozzles 248 extend downward from the injectors 244. Although only several of the nozzles 248 are shown for example purposes, each of the injectors 244 may have a respective one of the nozzles 248.

The showerhead 40 can be made of multiple layers that are connected together. More layers may be added to create additional plenums. In some examples, the showerhead 40 can be manufactured using vacuum brazing, tungsten inert gas (TIG) welding, or electron beam welding to enable complex and unique geometries at a reasonable cost. Vacuum braze joining allows the showerhead to be machined as flat plates with grooves cut into the plates with a layer of braze between each plate. Welding techniques require more complex sub-components for the weld to access all areas which require sealing. Posts and corresponding holes may be machined to raise the sealing area to the surface of the part where it is accessible to weld.

Referring now to FIG. 4, selected ones of the through holes 204 have diameters that are sized differently to alter/adjust the delivery of radicals. Each of the through holes 204 that are not labeled either A, B or C are the nominal type and have a nominal diameter dimension that will be described further below. The through holes 204 that are labeled type A, B or C have a different diameter dimension than the nominal diameter dimension as will be described further below.

In some examples, for the types A, B and C, the average size follows a predetermined ratio $(Davg\_typeX)^4/(Davg\_nom)^4 = ratio +/- 0.01''$, where $Davg\_typeX$ is the average diameter of the type X (which can be either A or B or C in our example) and $Davg\_nom$ is the average diameter of type nominal. In some examples, the ratio for type A is in a range of 1.3 to 1.6. In some examples, the ratio for type B is in a range of 0.8 to 1.0. In some examples, the ratio for type C is in a range of 1.0 to 1.2. As can be appreciated other combinations of hole sizes can achieve the same overall showerhead flow distribution. The foregoing example corrects for the azimuthal non-uniformity of a triangular pattern in a circular chamber. The hole size ratios can also be modulated radially to change the radial uniformity of deposition on the substrate. For example, for substrate processing systems configured to provide two or more different gases via the showerhead 40, modulating the hole size ratios corresponding to the different gases as described above changes a ratio between the amounts of the gases flowing out of the showerhead and into the processing chamber. In this manner, the hole size ratios can be adjusted to modulate a reactant ratio in specific regions and correct on wafer non-uniformities. In some examples, diameters of the injectors 244 (and/or respective nozzles 248) may be changed to modulate gas flow ratios in a similar manner. However, since there is a significantly greater number of the through holes 204 than injectors 244, changing diameters of the through holes 204 facilitates finer tuning of gas flow ratios.

In the example in FIG. 4, there are a total of 85 injectors 244 and a corresponding number of groups of through holes 204. Some of the through holes 204 located in a radially inner portion 252 of the plasma-facing surface 202 are type C. Some of the through holes 204 located in a radially outer portion 254 of the plasma-facing surface 202 are type A and type B. In some examples, 9 of the through holes 204 are selected to be type C. In some examples, 36 of the through holes 204 are selected to be type B. In some examples, six of the through holes 204 are selected to be type A. In some examples, 6 type B through holes and 1 type A through hole are arranged in each of six 60 degree pie-shaped slices 250.

Gas injectors are arranged in a circular bore with a center injector and repeated pattern around it. In FIG. 4, a single, central group 256 is surrounded by 6, 12, 18, 24 and 24 groups in respective concentric hexagonal regions for a total of 85 groups. For example, as shown in FIG. 4, the group 256 is surrounded by 6 triangular groups in a first hexagonal region 258. A second hexagonal region 260 includes 12 triangular groups. A third hexagonal region 262 includes 18 triangular groups. A fourth hexagonal region 264 and a fifth hexagonal region 266 each include 24 triangular groups. While the pattern of through holes around the gas injector includes 85 groups of through holes, the pattern can be changed in increments of 6 (i.e., a 6 increasing pattern where each successive surrounding region has 6 more groups than an adjacent inner region). Alternate patterns include a radial pattern with a 6 or 8 increasing pattern. A radial pattern with a 6 increasing pattern includes 61, 91, 127, or 169 injectors. A radial pattern with an 8 increasing pattern includes 81, 121, or 169 injectors. In some examples, the nominal type has a dimension of 0.06" to 0.40". The nominal hole diameter may be dependent on a pressure drop required for the flow, gas, and pressure conditions to enable flow distribution to be controlled with the through holes 204 without being dominated by other chamber geometry. Hole diameter may also be dependent upon desired flow rate, pressure, and gas species to prevent back diffusion of precursor gasses into the upper chamber 20.

Figure 5:
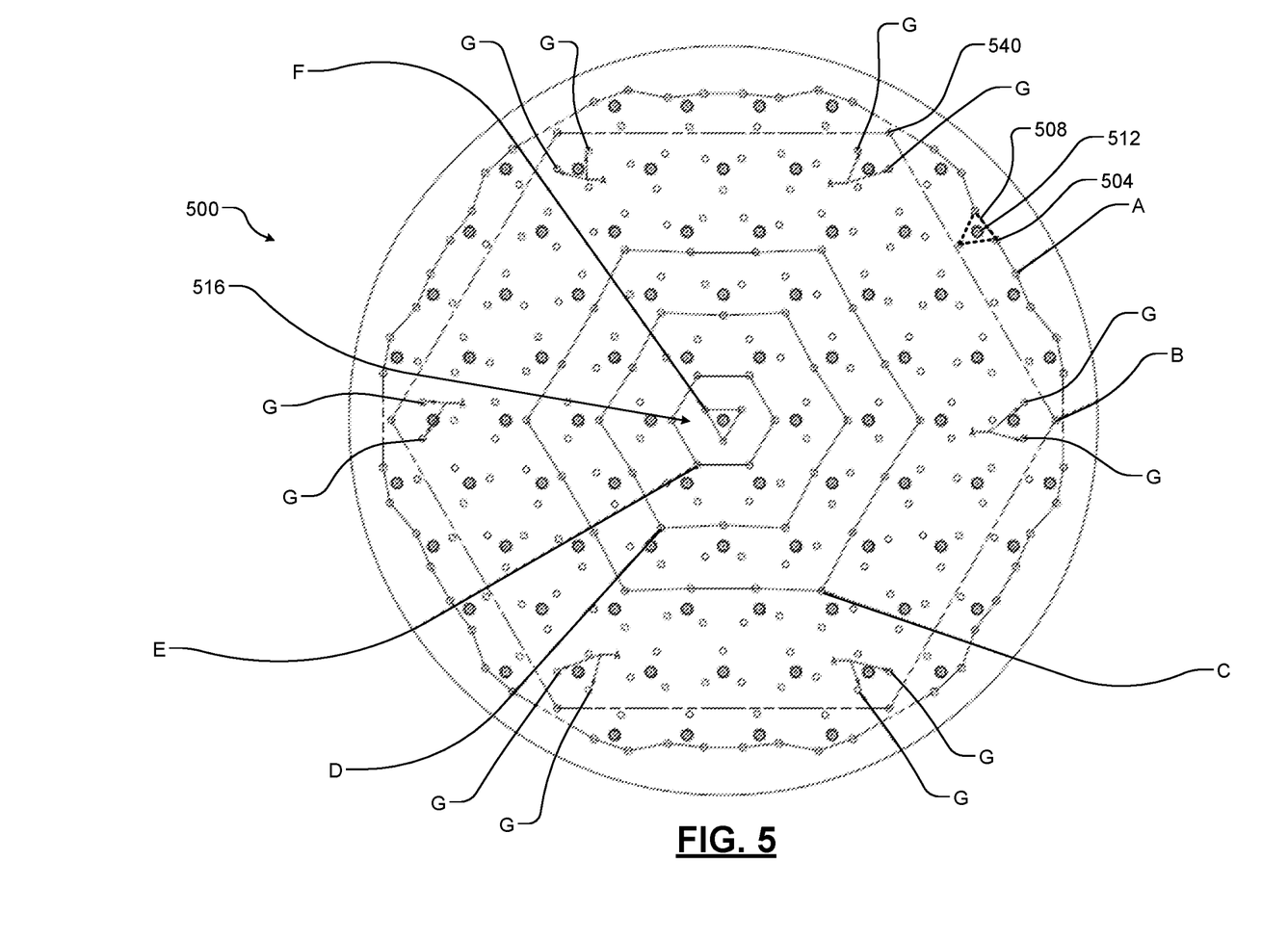
FIG. 5 illustrates a bottom view of another example showerhead according to the present disclosure.

FIG. 5 shows an example bottom view of a showerhead 500 according to the present disclosure. In this example, through holes 504 are arranged in a triangle based pattern in groups 508 clustered around respective injectors 512. A central group 516 is surrounded by successive hexagonal rings of 6 of the groups 508, 12 of the groups 508, 18 of the groups 508, 24 of the groups 508, and 24 of the groups 508, respectively. In this example, the outermost hexagonal ring of the groups 508 also includes additional through holes 540 not associated with a particular one of the groups 508 clustered around a respective one of the injectors 512. Instead, the through holes 540 are arranged in gaps in the pattern of the groups 508 in the outermost hexagonal ring.

Although referred to as "rings," the groups 508 are arranged in successive hexagonal patterns similar to the manner shown in FIG. 4.

Similar to the example described in FIG. 4, selected ones of the through holes 504 and 540 have diameters that are sized differently to alter/adjust the delivery of radicals as shown in FIG. 5. In this example, each of the through holes 504 and 540 that are not labeled either A, B, C, D, E, F (as indicated by the respective one of the profiles A-F connecting the respective through holes in FIG. 5), or G are the nominal type and have a nominal diameter dimension that will be described further below. The through holes 504 or 540 that are labeled type A, B or C have a different diameter dimension than the nominal diameter dimension as will be described further below.

In some examples, for the types A, B C, D, E, F, and G, the average size follows a predetermined ratio $(Davg\_typeX)^4/(Davg\_nom)^4=ratio+/-0.01"$, where Davg_typeX is the average diameter of the type X (which can be either A, B C, D, E, F, or G in our example) and Davg_nom is the average diameter of type nominal. In some examples, the ratio for type A is in a range of 1.3 to 1.6. In some examples, the ratio for type B is in a range of 1.1 to 1.4. In some examples, the ratio for type C is in a range of 1.1 to 1.4. In some examples, the ratio for type D is in a range of 1.1 to 1.4. In some examples, the ratio for type E is in a range of 1.2 to 1.5. In some examples, the ratio for type F is in a range of 0.7 to 1.0. In some examples, the ratio for type G is in a range of 0.7 to 1.0.

As can be appreciated other combinations of hole sizes can achieve the same overall showerhead flow distribution. The hole size ratios can also be modulated radially to change the radial uniformity of deposition on the substrate. In this manner, the hole size ratios can be adjusted to modulate a reactant ratio in specific regions and correct on wafer non-uniformities.

Figure 6A:
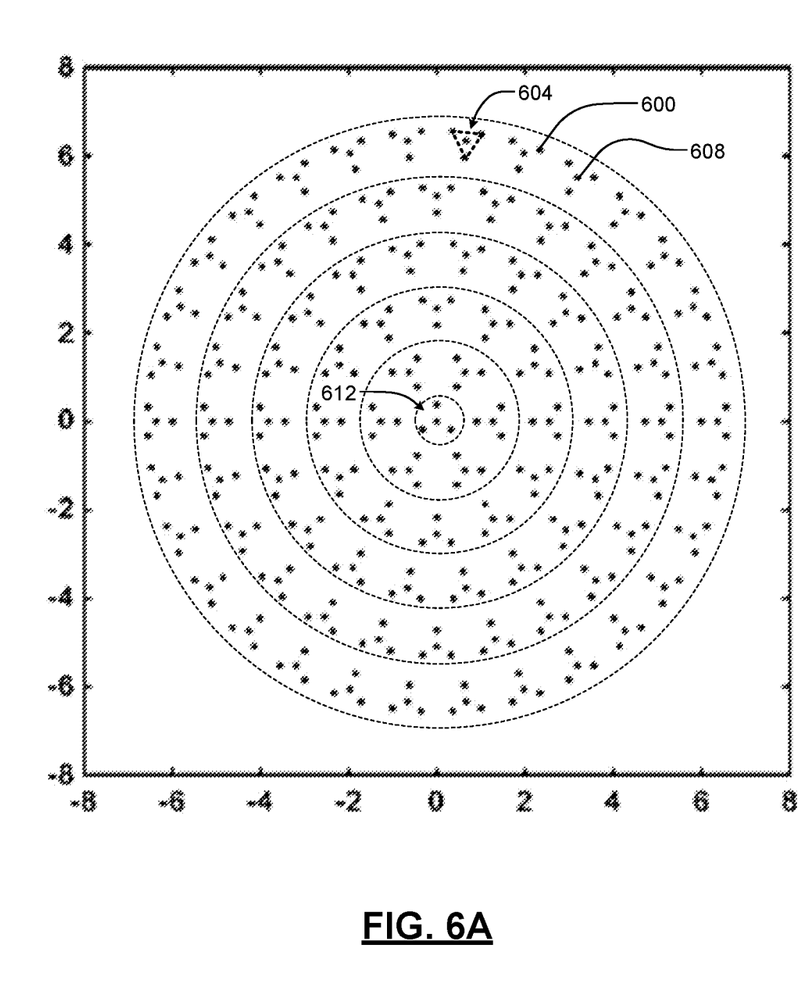
FIGS. 6A, 6B, and 6C illustrate other example hole patterns according to the present disclosure.
Figure 6B:
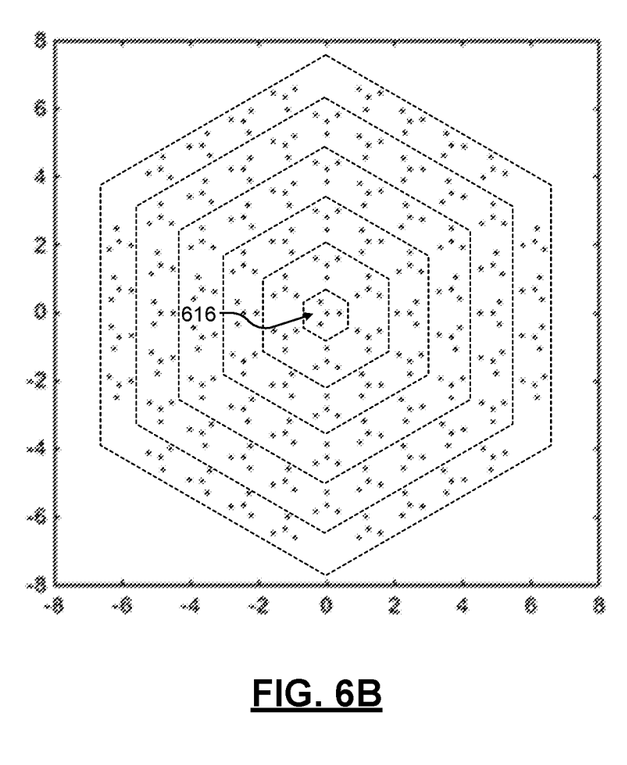
Figure 6C:
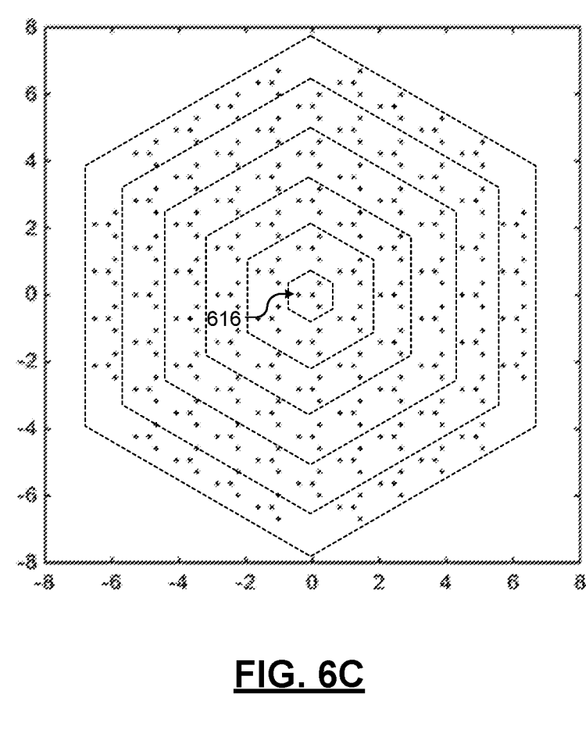

FIGS. 6A, 6B, and 6C illustrate other example hole patterns according to the present disclosure. In FIG. 6A, through holes 600 are arranged in a triangle based pattern in groups 604 clustered around respective injectors 608. A central group 612 is surrounded by 5 successive circular regions including 6, 12, 18, 24, and 30 of the groups 604, respectively (i.e., in a 6 increasing pattern). In each of FIGS. 6B and 6C, a central group 616 is surrounded by 5 successive hexagonal regions including 6, 12, 18, 24, and 24 of the groups 604, respectively.

In the examples shown in FIGS. 6A, 6B, and 6C, diameters of selected ones of the through holes 600 may be sized differently to alter/adjust the delivery of radicals in a manner similar to that described in FIGS. 4 and 5D. In other words, selected ones of the through holes 600 of a type X have a different diameter dimension than a nominal diameter dimension of the through holes 600. For example, selected ones of the through holes 600 have an average size that follows a predetermined ratio $(Davg\_typeX)^4/(Davg\_nom)^4=ratio+/-0.01"$, where Davg_typeX is the average diameter of the type X and Davg_nom is the average diameter of type nominal. In this manner, the hole size ratios can be adjusted to modulate a reactant ratio in specific regions and correct on wafer non-uniformities as described above in more detail.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A showerhead for a substrate processing system, the showerhead comprising:
    a lower surface;
    a plasma-facing upper surface;
    a gas plenum defined inside the showerhead between the lower surface and the upper surface;
    a plurality of injectors distributed on the lower surface and a plurality of gas injector nozzles extending downward from respective ones of the injectors on the lower surface, wherein the plurality of injectors is in fluid communication with the gas plenum such that gas exits from the gas plenum inside the showerhead through the plurality of injectors and the plurality of gas nozzles to a volume below the showerhead; and
    a plurality of through holes extending from the plasma-facing upper surface to the lower surface, wherein the plurality of through holes is in fluid communication with a volume above the plasma-facing upper surface and the volume below the showerhead, wherein selected ones of the plurality of through holes have a diameter that is different from a diameter of remaining ones of the plurality of through holes, and wherein the diameter of the selected ones of the plurality of through holes is predetermined in accordance with a desired ratio of respective gases provided via the selected ones of the plurality of through holes and the remaining ones of the plurality of through holes,
    wherein, on the lowersurface of the showerhead, the through holes are arranged in a plurality of separate groups each including two or more of the through holes distributed around a respective one of the plurality of injectors.

2. The showerhead of claim, wherein the selected ones of the plurality of through holes include a first type of through hole having an average diameter satisfying a predetermined ratio relationship with an average diameter of the remaining ones of the plurality of through holes.

3. The showerhead of claim 1, wherein the selected ones of the plurality of through holes includes at least a first type of through hole satisfying a first predetermined ratio relationship with an average diameter of the remaining ones of the plurality of through holes and a second type of through hole satisfying a second predetermined ratio relationship with an average diameter of the remaining ones of the plurality of through holes.

4. The showerhead of claim 1, wherein the diameter of the selected ones of the plurality of through holes is predetermined in accordance with deposition non-uniformities associated with showerhead.

5. The showerhead of claim 1 wherein, on the lower surface of the showerhead, the through holes are arranged in a plurality of groups each including three of the through holes distributed around a respective one of the plurality of injectors.

6. The showerhead of claim 5, wherein the three of the through holes in each of the plurality of groups are distributed in a triangle configuration around the respective one of the plurality of injectors.

7. The showerhead of claim 5, wherein the three of the through holes in each of the plurality of groups are radially distributed around the respective one of the plurality of injectors.

8. The showerhead of claim 1, wherein the plurality of through holes includes at least one central group of through holes and a first plurality of groups of the through holes arranged in a first hexagonal pattern around the at least one central group.

9. The showerhead of claim 8, further comprising a second plurality of groups of the through holes arranged in a second hexagonal pattern around the first plurality of groups.

10. The showerhead of claim 1, wherein the plurality of through holes includes at least one central group and a first plurality of groups of the through holes arranged in a first circular pattern around the at least one central group.

11. The showerhead of claim 10, further comprising at least one second plurality of groups of the through holes arranged in a second circular pattern around the first plurality of groups.

12. The showerhead of claim 1, wherein the plurality of through holes includes a plurality of groups of the through holes, wherein the plurality of groups of through holes includes at least one central group, wherein remaining groups of the plurality of groups are arranged in an increasing 6 pattern around the at least one central group, and wherein the increasing 6 pattern corresponds to an increase of 6 groups in each successive surrounding region of the at least one central group.

13. The showerhead of claim 1, wherein the plurality of through holes includes a plurality of groups of the through holes, wherein the plurality of groups of through holes includes at least one central group, wherein remaining groups of the plurality of groups are arranged in an increasing 8 pattern around the at least one central group, and wherein the increasing 8 pattern corresponds to an increase of 8 groups in each successive surrounding region of the at least one central group.

14. The showerhead of claim wherein the plurality of through holes includes 85 groups of the through holes.

* * * * *